United States Patent
Kondo

(10) Patent No.: US 9,414,489 B2
(45) Date of Patent: Aug. 9, 2016

(54) ELECTRONIC COMPONENT, MANUFACTURING METHOD FOR ELECTRONIC COMPONENT, ELECTRONIC APPARATUS, AND MOVING OBJECT

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/806,960

(22) Filed: Jul. 23, 2015

(65) Prior Publication Data

US 2016/0029484 A1 Jan. 28, 2016

(30) Foreign Application Priority Data

Jul. 24, 2014 (JP) ................. 2014-150485

(51) Int. Cl.
*H03B 5/32* (2006.01)
*H03H 9/05* (2006.01)
(Continued)

(52) U.S. Cl.
CPC .. *H05K 1/11* (2013.01); *H03B 5/32* (2013.01); *H03H 9/0528* (2013.01); *H03H 9/09* (2013.01); *H05K 1/111* (2013.01); *H05K 1/181* (2013.01); *H05K 3/4015* (2013.01); *H01L 24/32* (2013.01); *H01L 24/48* (2013.01); *H01L 2224/32225* (2013.01); *H01L 2224/48227* (2013.01); *H01L 2224/73265* (2013.01); *H01L 2924/00014* (2013.01); *H01L 2924/15312* (2013.01); *H01L 2924/161* (2013.01); *H01L 2924/163* (2013.01);

(Continued)

(58) Field of Classification Search
CPC ......... H03H 9/05; H03H 9/0528; H03H 9/09; H03B 5/30; H03B 5/32; H05K 1/11; H05K 1/111; H05K 1/181; H05K 3/4015; H05K 2201/09209
USPC .......... 310/348, 365, 366; 331/154, 156, 158; 439/68–73

See application file for complete search history.

(56) References Cited

U.S. PATENT DOCUMENTS 3,899,719 A * 8/1975 Murphy ................. H05K 7/103 361/773
4,531,792 A * 7/1985 Oshitani .............. H05K 7/1007 439/264

(Continued)

FOREIGN PATENT DOCUMENTS

JP H03-135056 A 6/1991
JP H07-297665 A 11/1995

(Continued)

*Primary Examiner* — Levi Gannon
(74) *Attorney, Agent, or Firm* — Oliff PLC

(57) ABSTRACT

In order to prevent deformation or damage of a base of a lead terminal by alleviating stress which concentrates on the base of the lead terminal protruding from an electronic component main body, the lead terminal includes a connection pad connected to a connection terminal provided on a first substrate, and a lead portion extending from the connection pad, and the lead terminal also includes a first surface connected to the connection terminal, a second surface that is a rear surface thereof, and a third surface that is a side surface, and in which the lead portion includes a first bent section and a third bent section that are bent in a direction intersecting the first surface or the second surface, a second bent section that is bent in a direction intersecting the third surface between the first bent section and the third bent section.

20 Claims, 10 Drawing Sheets

(51) Int. Cl.
*H03H 9/09* (2006.01)
*H05K 1/11* (2006.01)
*H05K 3/40* (2006.01)
*H05K 1/18* (2006.01)
*H01L 23/00* (2006.01)

(52) U.S. Cl.
CPC .................. *H01L 2924/1904* (2013.01); *H05K 2201/09209* (2013.01); *H05K 2201/10083* (2013.01)

(56) References Cited

U.S. PATENT DOCUMENTS

| | | | | |
|---|---|---|---|---|
| 5,982,076 A * | 11/1999 | Kim | ..................... | H01L 41/053 310/348 |
| 6,016,254 A * | 1/2000 | Pfaff | ..................... | H05K 7/1069 257/692 |
| 6,224,396 B1 * | 5/2001 | Chan | ..................... | H05K 3/325 439/66 |
| 6,307,305 B1 * | 10/2001 | Yoshio | ................ | H03H 9/0528 310/320 |
| 6,315,577 B1 | 11/2001 | Kugo | | |
| 7,083,428 B1 * | 8/2006 | Mahoney | ........... | G01R 1/06722 429/70 |
| 8,272,880 B2 * | 9/2012 | Tanaka | ................ | H05K 7/1069 439/71 |
| 2001/0008302 A1 * | 7/2001 | Murakami | .......... | H01L 23/3107 257/666 |

FOREIGN PATENT DOCUMENTS

| | | |
|---|---|---|
| JP | H07-321591 A | 12/1995 |
| JP | H09-219631 A | 8/1997 |
| JP | H10-144734 A | 5/1998 |
| JP | 2000-223812 A | 8/2000 |
| JP | 2001-053208 A | 2/2001 |
| JP | 2006-284373 A | 10/2006 |
| JP | 2012-049195 A | 3/2012 |

\* cited by examiner

ELECTRONIC COMPONENT, MANUFACTURING METHOD FOR ELECTRONIC COMPONENT, ELECTRONIC APPARATUS, AND MOVING OBJECT

BACKGROUND

1. Technical Field

The present invention relates to an electronic component, a manufacturing method for the electronic component, an electronic apparatus, and a moving object.

2. Related Art

In the related art, in order to prevent damage due to stress such as an impact applied to a connected circuit board, an electronic component is known which includes an electronic component main body on which electronic elements are mounted and a lead terminal connected to the electronic component main body, in which the electronic component main body is connected to the circuit board via the lead terminal (for example, refer to JP-A-2000-223812 and JP-A-7-321591). In the electronic component with such a configuration, stress such as an impact applied to the circuit board or the electronic component main body is absorbed or distributed through deformation of the lead terminal, and thus the electronic component can be prevented from being damaged.

The electronic component disclosed in JP-A-2000-223812 has a configuration in which an impact buffering portion which is bent in one direction is provided at each of a plurality of lead terminals extending from the electronic component main body. In addition, the electronic component disclosed in JP-A-7-321591 has a configuration in which a tabular elastic lead plate having a linear tip end portion is connected to a lead terminal protruding from a metal housing (electronic component main body) in which a quartz crystal vibrator element is stored, and the tip end portion of the elastic lead plate is connected to the circuit board.

However, in the above-described configurations, a base of the lead terminal protruding from the electronic component main body or a connection portion between the lead terminal and the elastic lead plate is not elastic. For this reason, depending on the amount of applied stress, the stress may not be sufficiently absorbed by the bent portion of the lead terminal or the elastic lead plate but may concentrate on the base of the lead terminal, and thus there is a concern that the base of the lead terminal may be bent, or damage such as a crack may occur.

SUMMARY

An advantage of some aspects of the invention is to solve at least a part of the problems described above, and the invention can be implemented as the following forms or application examples.

APPLICATION EXAMPLE 1

An electronic component according to this application example includes: a substrate that is provided with a connection terminal; and a lead terminal that includes a first surface, a second surface which is a rear surface of the first surface, and a third surface which connects the first surface to the second surface, and includes a connection pad, a lead portion extending from the connection pad, and a lead end portion provided at the lead portion on an opposite side to the connection pad, wherein the first surface of the connection pad is connected to the connection terminal via a joining member, and wherein the lead portion includes a first bent section that is bent in a direction intersecting the first surface or the second surface; a second bent section that is bent in a direction intersecting the third surface between the first bent section and the lead end portion; and a third bent section that is bent in a direction intersecting the first surface or the second surface between the second bent section and the lead end portion.

According to this application example, since the lead terminal is provided with the first bent section, the second bent section, and the third bent section, stress applied to the lead terminal is absorbed or distributed by each of the first bent section, the second bent section, and the third bent section. Consequently, it is possible to reduce a concern that the connection pad connected to the substrate or the lead portion near the connection pad may be deformed or damaged due to stress applied to the lead terminal.

APPLICATION EXAMPLE 2

In the electronic component according to the application example described above, it is preferable that the first bent section and the third bent section are bent toward the second surface from the first surface.

According to this application example, the connection pad and the lead end portion protrude in the same direction with the first bent section and the third bent section as base points. Consequently, it is possible to reduce a volume occupied by the lead terminal and thus to miniaturize the electronic component.

APPLICATION EXAMPLE 3

In the electronic component according to the application example described above, it is preferable that the first bent section is bent toward the second surface from the first surface, and the third bent section is bent toward the first surface from the second surface.

According to this application example, since the first bent section and the third bent section are bent in opposite directions to each other, the connection pad and the lead end portion do not overlap each other in a plan view. Consequently, for example, when connection or the like of the lead end portion is performed, a process can be performed without being impeded by the substrate connected to the connection pad.

APPLICATION EXAMPLE 4

In the electronic component according to the application example described above, it is preferable that the lead terminal is provided in plurality, and the second bent sections of the lead terminals disposed at both ends of the plurality of lead terminals are bent toward the adjacent lead terminals.

According to this application example, the second bent sections of the lead terminals disposed at both ends do not protrude toward both sides of an arrangement of the plurality of lead terminals. Consequently, it is possible to reduce the size of an arrangement region of the plurality of arranged lead terminals and thus to miniaturize an electronic component.

APPLICATION EXAMPLE 5

In the electronic component according to the application example described above, it is preferable that an electronic element is disposed on a surface of the substrate on which the connection terminal of the substrate is provided.

According to this application example, even if an external force such as an impact is applied to the substrate, an electronic element can be protected by stress alleviation via the lead terminal, and thus it is possible to improve the reliability of an electronic component.

APPLICATION EXAMPLE 6

A manufacturing method according to this application example is directed to a manufacturing method for an electronic component including a substrate that is provided with a connection terminal; and a lead terminal that includes a first surface, a second surface which is a rear surface of the first surface, and a third surface which connects the first surface to the second surface, and includes a connection pad, a lead portion extending from the connection pad, and a lead end portion provided at the lead portion on an opposite side to the connection pad, in which the first surface of the connection pad is connected to the connection terminal via a joining member, and in which the lead portion includes a first bent section that is bent in a direction intersecting the first surface or the second surface; a second bent section that is bent in a direction intersecting the third surface between the first bent section and the lead end portion; and a third bent section that is bent in a direction intersecting the first surface or the second surface between the second bent section and the lead end portion. The manufacturing method includes: connecting the connection pad of the lead terminal provided with the second bent section to the connection terminal; and forming the first bent section and the third bent section.

According to this application example, it is possible to manufacture the electronic component in which the lead terminal connected to the connection terminal is provided with the first bent section, the second bent section, and the third bent section. Consequently, it is possible to provide the electronic component in which stress applied to the substrate or the lead terminal is absorbed or distributed by each of the first bent section, the second bent section, and the third bent section, and thus the connection pad or the lead portion near the connection pad can be prevented from being deformed or damaged.

APPLICATION EXAMPLE 7

In the manufacturing method for an electronic component according to the application example described above, it is preferable that the manufacturing method further includes preparing a lead frame in which a recess is provided at a connecting portion in a direction intersecting the first surface or the second surface before connecting the connection pad to the connection terminal, a plurality of lead terminals being connected to adjacent lead terminals via the connecting portion, wherein the forming of the first bent section and the third bent section includes removing the connecting portion.

According to this application example, the lead frame is connected to the substrate by using the lead frame in which a plurality of lead terminals are connected to each other via the connecting portion, and then the connecting portion is removed. Thus, it is possible to easily form an electronic component in which the lead terminals are connected to the electronic component.

APPLICATION EXAMPLE 8

An electronic apparatus according to this application example includes the electronic component according to any one of the application examples described above.

According to this application example, since the electronic apparatus includes the electronic component which can prevent deformation or damage of the connection pad or the lead portion near the connection pad when stress such as an impact is applied to the lead terminal, it is possible to provide the electronic apparatus whose reliability is improved.

APPLICATION EXAMPLE 9

A moving object according to this application example includes the electronic component according to any one of the application examples described above.

According to this application example, since the moving object includes the electronic component which can prevent deformation or damage of the connection pad or the lead portion near the connection pad when stress such as an impact is applied to the lead terminal, it is possible to provide the moving object whose reliability is improved.

BRIEF DESCRIPTION OF THE DRAWINGS

The invention will be described with reference to the accompanying drawings, wherein like numbers reference like elements.

FIGS. 1A and 1B are schematic configuration diagrams of an oscillator as an example of an electronic component of a first embodiment of the invention, in which FIG. 1A is a front sectional view and FIG. 1B is a side view which is viewed from a Q2 direction.

FIGS. 5A and 5B are schematic configuration diagrams of an oscillator as an example of an electronic component of a second embodiment of the invention, in which FIG. 5A is a front sectional view and FIG. 5B is a side view which is viewed from a Q2 direction.

FIGS. 6A and 6B are schematic configuration diagrams of an oscillator as an example of an electronic component of a third embodiment of the invention, in which FIG. 6A is a front sectional view and FIG. 6B is a side view which is viewed from a Q2 direction.

FIGS. 7A to 7C illustrate modification examples of a second bent portion of the lead terminal, in which FIG. 7A is a front view illustrating Modification Example 1, FIG. 7B is a front view illustrating Modification Example 2, and FIG. 7C is a front view illustrating Modification Example 3.

FIGS. 8A and 8B are schematic diagrams illustrating electronic apparatuses including the electronic component according to one embodiment of the invention, in which FIG. 8A is a perspective view illustrating a configuration of a mobile type (or notebook type) personal computer, and FIG. 8B is a perspective view illustrating a configuration of a mobile phone (including PHS).

DESCRIPTION OF EXEMPLARY EMBODIMENTS

Hereinafter, embodiments of the invention will be described in detail with reference to the drawings.

Electronic Component

First Embodiment

Configuration

Figure 1A:
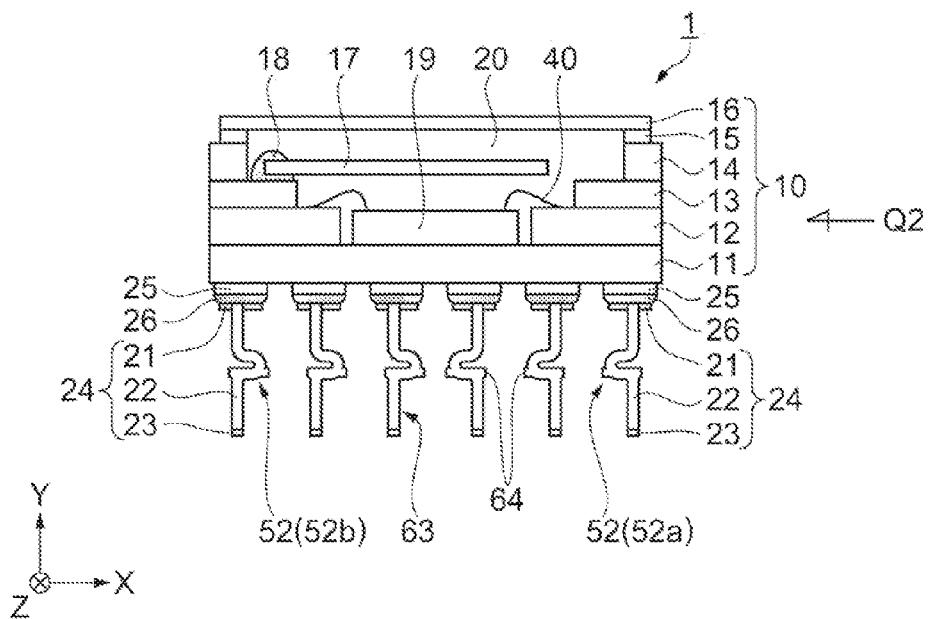
Figure 1B:
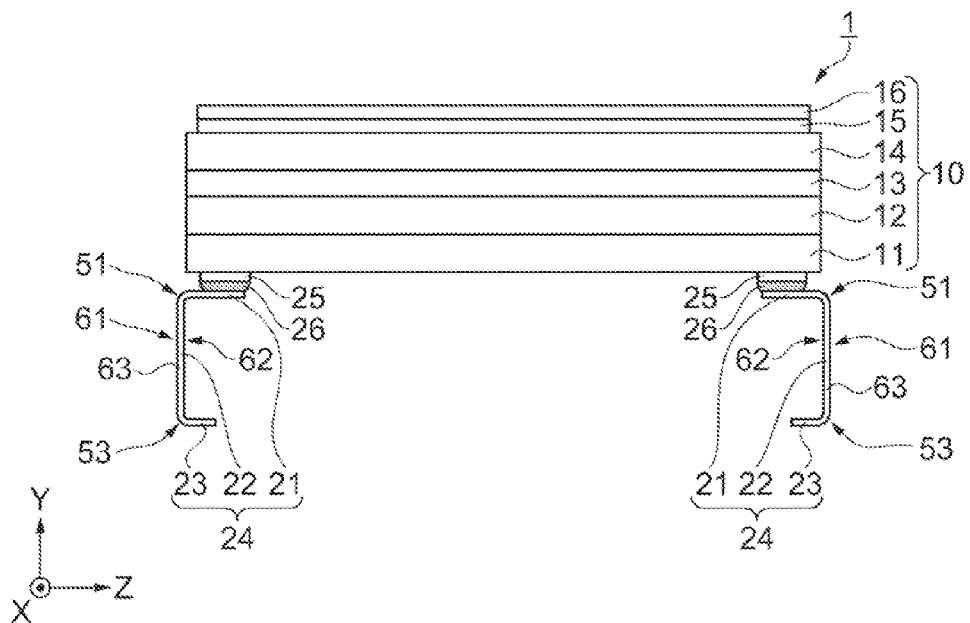

With reference to FIGS. 1A and 1B, an oscillator as an example of an electronic component according to a first embodiment of the invention will be described by exemplifying a quartz crystal oscillator including an SC cut quartz crystal vibrator element having good frequency stability. FIGS. 1A and 1B are schematic diagrams illustrating a structure of an oscillator as an example of an electronic component according to the first embodiment of the invention, in which FIG. 1A is a front sectional view, and FIG. 1B is a side view which is viewed from a direction of Q2 illustrated in FIG. 1A. For convenience of description, three axes perpendicular to each other are indicated as an X axis, a Y axis, and a Z axis not only in these drawings but also the drawings to be described later. For convenience of description, in a plan view which is viewed from the Y axis direction, a surface in the +Y axis direction is set to an upper surface, and a surface in the −Y axis direction is set to a lower surface. A wiring pattern or an electrode pad formed in a container 10 including a first substrate 11 is not illustrated.

As illustrated in FIGS. 1A and 1B, a quartz crystal oscillator 1 includes the container 10 which stores a quartz crystal vibrator element 17 in an internal space 20 and an integrated circuit 19 including an oscillation circuit; and lead terminals 24 which are connected to connection terminals 25 provided on a lower surface (a surface opposite to the internal space 20 side) of the first substrate 11 constituting the container 10. The first substrate 11 constituting the container 10 corresponds to a substrate in the appended claims.

The integrated circuit 19 and the quartz crystal vibrator element 17 are stored in the container 10. The container 10 is air-tightly sealed in a depressed atmosphere such as vacuum state or pressure lower than the atmospheric pressure, or in an atmosphere of an inert gas such as nitrogen, argon, or helium. The container 10 includes the first substrate 11, a second substrate 12, a third substrate 13, and a fourth substrate 14 which are stacked on each other, and a lid member 16 which is connected to the fourth substrate 14 via a sealing member 15. The second substrate 12, the third substrate 13, and the fourth substrate 14 are an annular body of which a central portion is removed, and the sealing member 15 such as a seal ring or low melting point glass is formed on a circumferential edge of an upper surface of the fourth substrate 14. As constituent materials of the first substrate 11, the second substrate 12, the third substrate 13, and the fourth substrate 14, ceramics or the like are preferably used. In addition, as constituent materials of the first substrate 11, the second substrate 12, the third substrate 13, and the fourth substrate 14, glass, a resin, a metal, or the like may be used in addition to ceramics.

A recess (cavity) for accommodating the integrated circuit 19 is formed by the second substrate 12 and the third substrate 13, and a recess (cavity) for accommodating the quartz crystal vibrator element 17 is formed by the third substrate 13 and the fourth substrate 14.

The integrated circuit 19 is joined to an upper surface of the first substrate 11 via a joining member (not illustrated) at a portion where a central portion of the second substrate 12 is removed. The integrated circuit 19 is electrically connected to electrode pads (not illustrated) disposed on an upper surface of the second substrate 12 via bonding wires 40. The quartz crystal vibrator element 17 is joined to a predetermined position on an upper surface of the third substrate 13 via a joining member 18 such as a conductive adhesive. The quartz crystal vibrator element 17 other than the portion joined via the joining member 18 is held so as to be separated from other constituent elements in the internal space 20.

The connection terminals 25 which are electrically connected to, for example, the quartz crystal vibrator element 17 or the integrated circuit 19 via wirings (not illustrated) are provided on a lower surface of the first substrate 11 serving as the lower surface of the container 10. The connection terminals 25 of the present embodiment are provided on both end sides of the lower surface of the first substrate 11 in the Z axis direction (width direction) and are arranged in groups of six at predetermined intervals in the X axis direction, and thus a total of twelve connection terminals are disposed. In the present embodiment, the number of connection terminals 25 is twelve, but the number of connection terminals 25 is not limited and is arbitrary. The connection terminals 25 are formed by screen printing a metal wiring material such as tungsten (W) or molybdenum (Mo) on a substrate on which the connection terminals 25 will be formed, baking the material at a high temperature, and plating the material with nickel (Ni) or gold (Au).

Each of the lead terminals 24 connected to the connection terminals 25 includes a connection pad 21 connected to the connection terminal 25 via a joining member 26, a lead portion 22 extending from the connection pad 21, and a lead end portion 23 extending from the lead portion. The lead end portion 23 is a portion connected to a mounting substrate (not illustrated), and is a portion which is provided near an end of the lead portion 22 on an opposite side to the connection pad 21 and is located between a third bent portion 53 which will be described later and one end of the lead terminal 24. The lead terminal 24 has a narrow tabular shape, and includes a first surface 61 which is a surface connected to the connection terminal 25, a second surface 62 which is a rear surface of the first surface 61, and a third surface 63 which is a side surface connecting the first surface 61 to the second surface 62. The joining member 26 connecting the connection terminal 25 to the connection pad 21 may employ a conductive joining member such as solder.

The lead portion 22 which extends from the connection pad 21 connected to the connection terminal 25 in a direction along the Z axis includes a first bent section 51 which is bent in a downward direction (−Y axis direction) which is a direction intersecting the first surface 61 or the second surface 62 in the vicinity of the end of the container 10. A second bent section 52 which is bent in the X axis direction which is a direction intersecting the third surface 63 is provided between the first bent section 51 and the lead end portion 23 of the lead portion 22 extending from the first vent section 51. In addition, the third bent section 53 which is bent in the Z axis direction which is a direction intersecting the first surface 61 or the second surface 62 is further provided in the lead portion 22 between the second bent section 52 and the lead end portion 23.

Since the configuration of the lead terminal 24 is used, stress applied to the lead terminal 24 is absorbed or distributed by each of the first bent section 51, the second bent section 52, and the third bent section 53. Consequently, it is possible to reduce deformation or damage of the connection pad 21 or the lead portion 22 near the connection pad 21, caused by the stress being applied to the lead terminal 24, or to reduce deterioration in the joining strength due to a crack or the like generated in the joining member 26 connecting the connection terminal 25 to the connection pad 21.

The first bent section 51 and the third bent section 53 in the present embodiment are bent toward the second surface 62 from the first surface 61 of the lead terminal 24. In other words, the first bent section 51 and the third bent section 53 are mountain-folded with the first surface 61 of the lead terminal 24 as the outside (front side). As mentioned above, the lead terminal 24 of the present embodiment has a so-called J lead type shape in which the extension direction of the lead portion 22 extending from the connection pad 21 to the first bent section 51 is opposite to the extension direction of the lead end portion 23 from the third bent section 53.

As mentioned above, in the so-called J lead type lead terminal 24, when the end of the lead terminal 24 is viewed from the first bent section 51 and the third bent section 53, the connection pad 21 and the lead end portion 23 protrude in the same direction. In other words, the connection pad 21 and the lead end portion 23 protrude in the same direction with the first bent section 51 and the third bent section 53 as base points. Consequently, it is possible to reduce a volume occupied by the lead terminal 24 in the bent direction (Z axis direction), and thus to reduce a size of the quartz crystal oscillator 1 in the Z axis direction.

Among the plurality of lead terminals 24 which are disposed in a row, the second bent sections 52a and 52b of the respective lead terminals 24 located at both ends are bent in directions toward the lead terminals 24 disposed to be adjacent thereto. In other words, the second bent sections 52a and 52b of the lead terminals 24 located at ends of the row are folded toward a central side (inside) of the row.

As mentioned above, since the second bent sections 52a and 52b of the lead terminals 24 located at the ends of the row are bent toward the central side of the row, the second bent sections 52a and 52b do not protrude outward in the arrangement direction of the row from the lead portions 22 located at the ends of the row. Consequently, it is possible to reduce the size of an arrangement region of the plurality of arranged lead terminals 24 and thus to reduce the size of the quartz crystal oscillator 1 in the X axis direction.

In the configuration in which the container 10 is supported by the plurality of lead terminals 24 disposed in the row, the first bent section 51, the second bent section 52, and the third bent section 53 are provided, and thus stress from any of the three directions along the X axis, the Y axis, and the Z axis can be absorbed or distributed. Particularly, in relation to stress in the arrangement direction (X axis direction) of the row, the second bent section 52 is provided, and thus the stress can be absorbed or distributed.

As a constituent material of the lead terminal 24, a plate material such as 42 alloy (iron-nickel alloy) or a copper alloy which is highly conductive and is relatively favorably moldable is preferably used, and surface treatment such as nickel plating is performed on the plate material and is then used. A tie bar mark 64 is a trace which remains in the second bent section 52 constituting the lead terminal 24 by cutting out and removing a connecting portion 45 (refer to FIG. 2) of a lead frame 42 (refer to FIG. 2) used in a manufacturing method which will be described later.

According to the quartz crystal oscillator 1 according to an electronic component as described above, the first bent section 51, the second bent section 52, and the third bent section 53 are provided in the lead terminal 24, and thus stress applied to the lead terminal 24 is absorbed or distributed by each of the bent sections. Particularly, since elastic deformation tends to occur in the first bent section 51 and the third bent section 53 due to stress applied to the lead terminal 24 in the Y axis direction and the Z axis direction, the stress in these directions is effectively alleviated. In addition, since elastic deformation tends to occur in the second bent section 52 due to stress applied to the lead terminal 24 in the Y axis direction and the X axis direction, the stress in these directions is effectively alleviated. As mentioned above, even if stress is applied in any direction, the stress is alleviated by the lead terminal 24, and thus it is possible to reduce a concern that the connection pad 21 connected to the first substrate 11 (the container 10) or the lead portion 22 near the connection pad 21 may be deformed or damaged (cracked or ruptured) due to stress applied to the lead terminal 24, or to reduce deterioration in the joining strength due to a crack or the like generated in the joining member 26 connecting the connection terminal 25 to the connection pad 21.

Manufacturing Method

Figure 2:
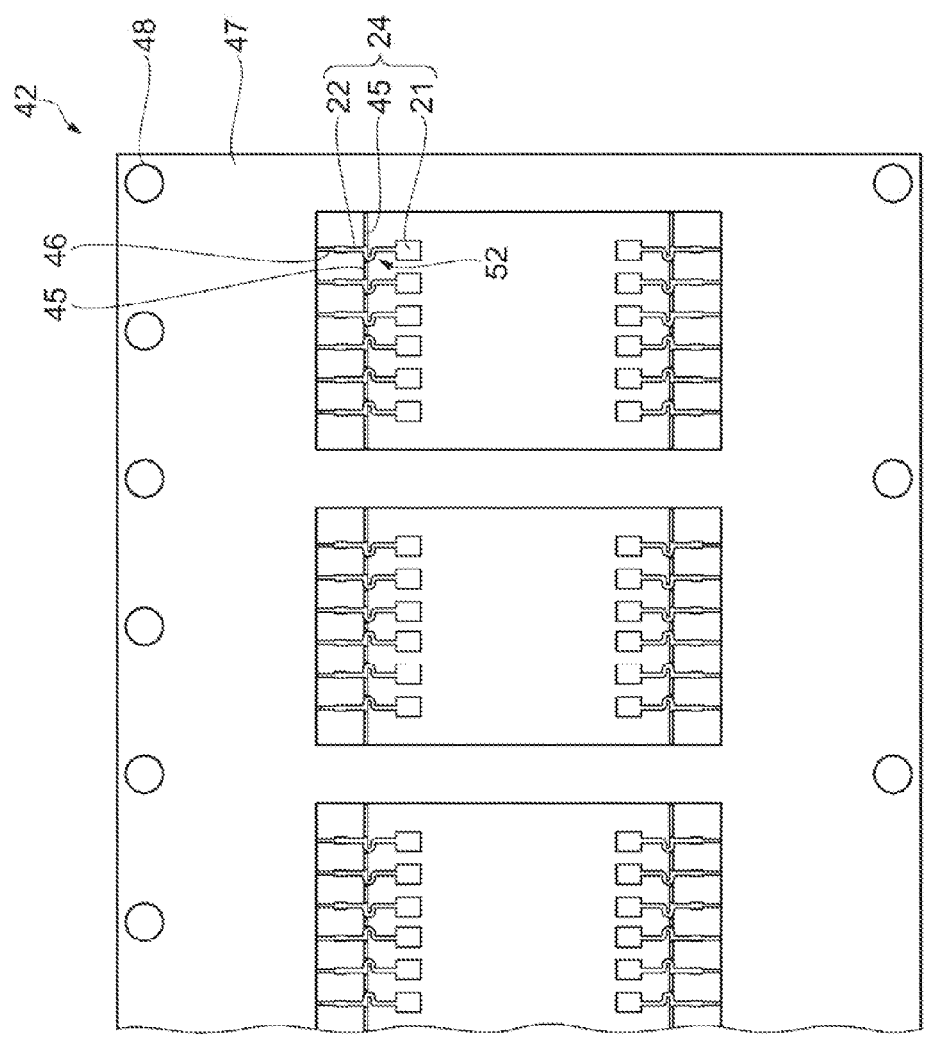
FIG. 2 is a plan view schematically illustrating a lead frame provided with lead terminals.
Figure 3A:
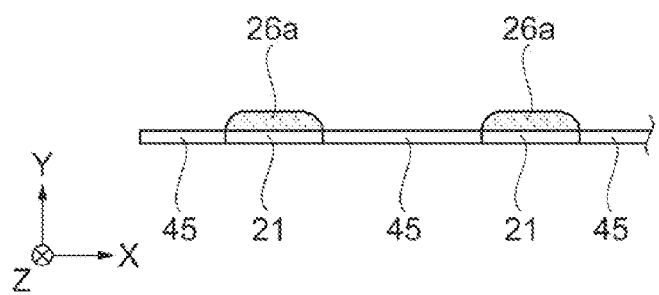
FIGS. 3A and 3B are front sectional views illustrating a step flow related to connection of the lead terminal among manufacturing steps of the oscillator according to the first embodiment.
Figure 3B:
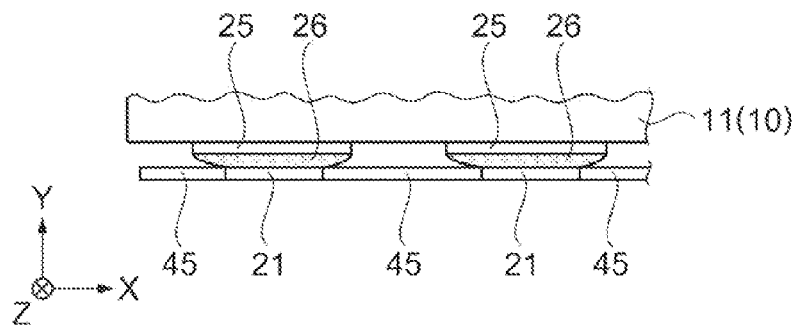
Figure 4A:
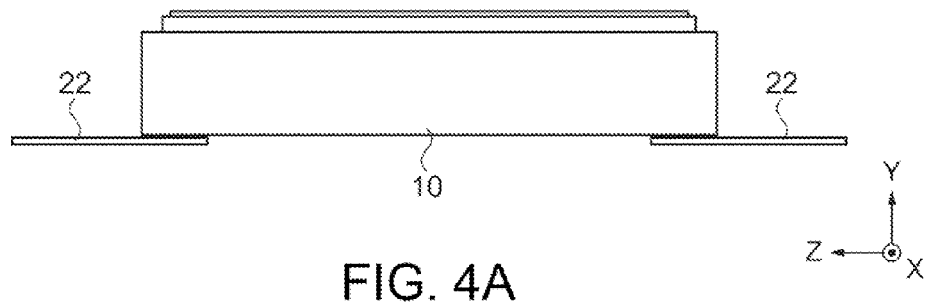
FIGS. 4A to 4C are front sectional views illustrating a step flow related to a bending process of the lead terminal among manufacturing steps of the oscillator according to the first embodiment.
Figure 4B:
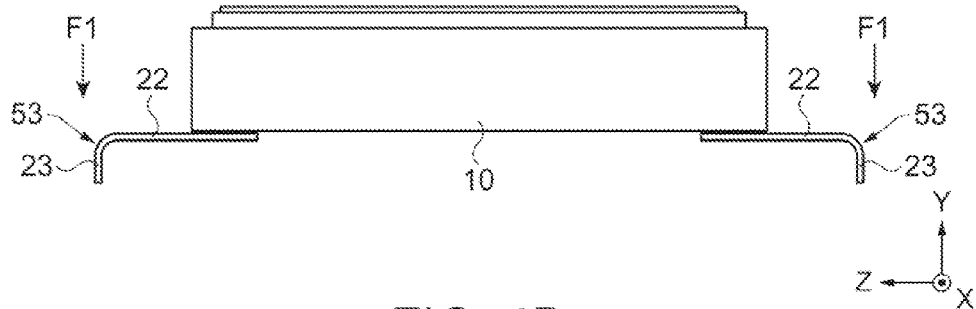
Figure 4C:
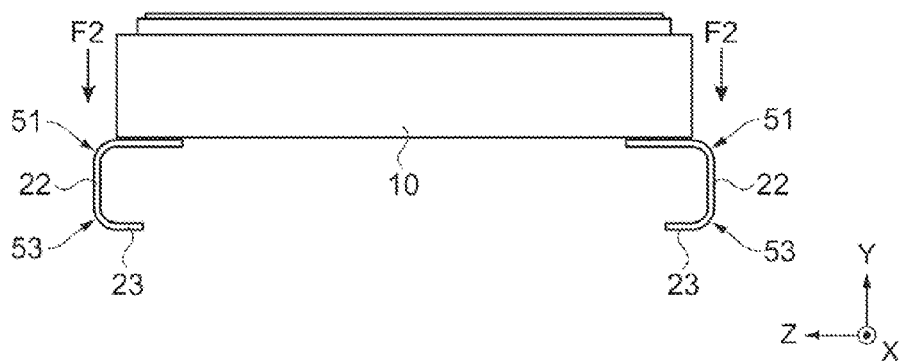

Next, with reference to FIGS. 2 to 4C, a schematic manufacturing method of the quartz crystal oscillator 1 as a kind of oscillator which is an example of an electronic component according to the first embodiment of the invention will be described. FIG. 2 is a schematic plan view of the lead frame provided with lead terminals. FIGS. 3A and 3B are front sectional views illustrating a step flow related to connection of the lead terminal among manufacturing steps of the quartz crystal oscillator according to the first embodiment, and FIGS. 4A to 4C are front sectional views illustrating a step flow related to a bending process of the lead terminal among the manufacturing steps of the oscillator according to the first embodiment. The same constituent elements as those of the above-described quartz crystal oscillator 1 are given the same reference numerals.

Preparation Step

First, with reference to FIG. 2, a description will be made of a preparation step of preparing the lead frame 42 on which a plurality of lead terminals 24 (refer to FIGS. 1A and 1B) are provided.

As illustrated in FIG. 2, the lead frame 42 is provided in which the connection pads 21 of the plurality of lead terminals 24 are disposed at positions corresponding to the connection terminals 25 (refer to FIGS. 1A and 1B) disposed on the first substrate 11 (refer to FIGS. 1A and 1B), lead terminal groups are provided in which the lead terminals 24 are connected to a frame 47 and the lead terminals 24 are connected to each other via connecting portions (tie bars) 45 and 46, and the lead terminal groups are arranged at a predetermined pitch.

Each of the lead terminals 24 constituting the lead frame 42 is provided with the lead portion 22 and the second bent section 52. In addition, the connecting portions 45 and 46 are provided with recesses which are depressed in a direction intersecting the first surface 61 (refer to FIGS. 1A and 1B) or the second surface 62 (refer to FIGS. 1A and 1B) of the lead terminal 24 so as to be easily removed in a second step which will be described later. The connecting portion 45 connecting the adjacent lead terminals 24 to each other is provided at a position corresponding to the second bent section 52. Since the connecting portion 45 is disposed in the above-described manner, a bending process can be performed on the first bent section 51 or the third bent section 53 in a state in which the connecting portion 45 remains in the second step which will be described later, and thus the first bent section 51 or the third bent section 53 can be easily formed.

In addition, guide holes 48 which are arranged at a predetermined pitch are provided in the frame 47 of the lead frame 42. The guide holes 48 are used to position the lead frame 42.

The lead frame 42 may be formed by processing a thin plate of 42 alloy (iron-nickel alloy), a copper alloy, or the like which is a constituent material of the lead terminal 24 by employing a photo-etching method or a stamping (press) method using a mold.

Connection Step

Next, with reference to FIGS. 3A and 3B, a description will be made of a first step in which the connection pad 21 of the lead terminal 24 provided with the second bent section 52 is connected to the connection terminal 25. The container 10 including the first substrate 11 described below has the same configuration as described above, and thus description thereof will be omitted.

In the connection step, first, as illustrated in FIG. 3A, a pasty joining member 26a is applied (coated) on the connection pad 21 disposed on the lead frame 42 (refer to FIG. 2). As the pasty joining member 26a, for example, a solder paste or the like is used which has an appropriate viscosity as a result of adding flux to solder powder. For example, a printing method using a metal mask or an ejection method using, for example, a dispenser may be employed in the application (coating) of the pasty joining member 26a. The joining member 26a is not limited thereto, and, for example, a conductive adhesive may be used in which gold, silver, copper, or other metal filters are mixed with a thermosetting resin.

In the connection step, next, as illustrated in FIG. 3B, the connection pad 21 is connected to the connection terminal 25 provided on the first substrate 11 (the container 10) via the pasty joining member 26a applied (coated) onto the connection pad 21. The first substrate 11 is placed via the joining member 26a so that the connection terminal 25 overlaps the connection pad 21 in a plan view which is viewed in the Y axis direction. Then, the pasty joining member 26a is heated to a melting temperature, and thus a joining material of the pasty joining member 26a is melted and a solvent such as the flux is also removed, thereby allowing the joining member 26 to be formed by the melted joining material (for example, a solder). For example, in a case of using a thermosetting conductive adhesive, heating is performed to a temperature which is equal to or higher than a curing temperature of the conductive adhesive, and thus the joining member 26 is formed.

Bent Section Formation Step

Next, with reference to FIGS. 4A to 4C, a description will be made of a bent section formation step including a step of forming the first bent section 51 and the third bent section 53 and a step of removing the connecting portions (tie bars) 45 and 46 (refer to FIG. 2) formed on the lead frame 42 (refer to FIG. 2).

In the bent section formation step, first, as illustrated in FIG. 4A, the lead portion 22 (the lead terminal 24) connected to the container 10 in the above-described connection step is placed on a mold (die) (not illustrated). In this case, the lead portion 22 and the container 10 are disposed on the lead frame 42 (refer to FIG. 2).

Next, as illustrated in FIG. 4B, the third bent section 53 is formed by applying a force to the lead portion 22 in the direction of an arrow F1 by using a mold (punch). The third bent section 53 is formed, and thus the lead end portion 23 is formed in the −Y axis direction.

Next, as illustrated in FIG. 4C, the first bent section 51 is formed by applying a force to the lead portion 22 in the direction of an arrow F2 by using the mold (punch). The first bent section 51 is formed, and thus the lead end portion 23 is directed toward the central side of the container 10 in the Z axis direction so that the so-called J lead type lead terminal 24 is formed.

Next, although not illustrated, the connecting portions (tie bars) 45 and 46 (refer to FIG. 2) formed on the lead frame 42 (refer to FIG. 2) are removed so that the container 10 and the lead portion 22 (the lead terminal 24) connected to the container 10 are detached from the lead frame 42, and thus a separate quartz crystal oscillator 1 is formed.

Through the above-described steps, it is possible to manufacture the quartz crystal oscillator 1 as an electronic component in which the first bent section 51, the second bent section 52, and the third bent section 53 are provided at the lead terminal 24. Consequently, stress applied to the container 10 (the first substrate 11), the lead terminal 24, and the like is absorbed or distributed by the three bent sections, and thus it is possible to provide the quartz crystal oscillator 1 as an electronic component which can reduce a concern that the connection pad 21 or the lead portion 22 near the connection pad 21 may be deformed or damaged, or can reduce deterioration in the joining strength due to a crack or the like generated in the joining member 26 connecting the connection terminal 25 to the connection pad 21.

Second Embodiment

Figure 5A:
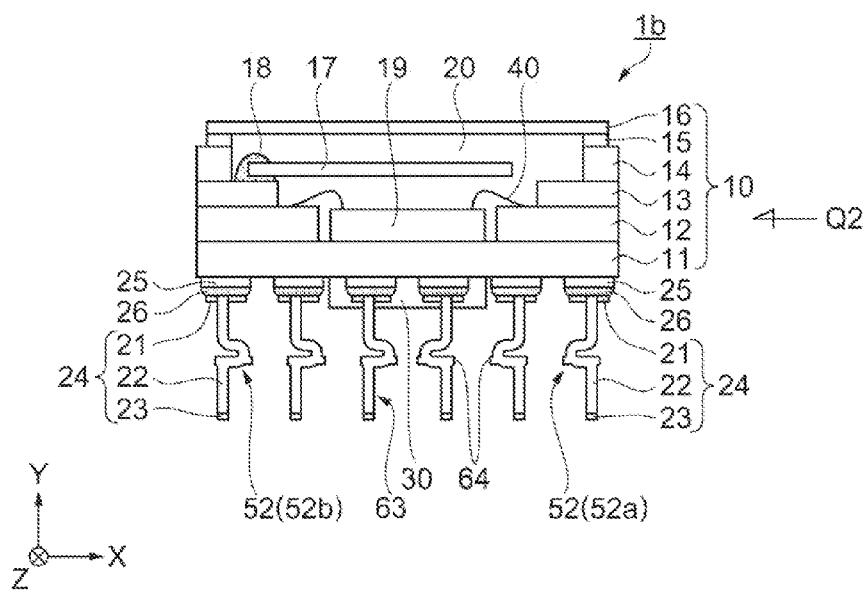
Figure 5B:
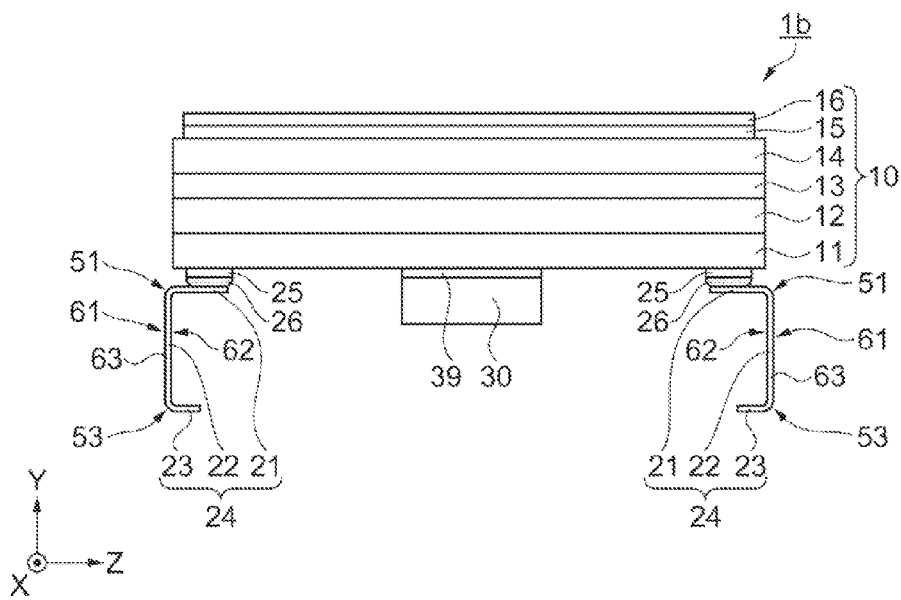

With reference to FIGS. 5A and 5B, an oscillator as an example of an electronic component according to a second embodiment of the invention will be described by exemplifying a quartz crystal oscillator including an SC cut quartz crystal vibrator element.

FIGS. 5A and 5B are schematic diagrams illustrating a structure of an oscillator as an example of an electronic component according to the second embodiment of the invention, in which FIG. 5A is a front sectional view, and FIG. 5B is a side view which is viewed from a direction of Q2 illustrated in FIG. 5A. In the description of the second embodiment, the same constituent elements as those of the first embodiment are given the same reference numerals, and description thereof will be omitted.

As illustrated in FIGS. 5A and 5B, a quartz crystal oscillator 1b of the second embodiment has a configuration in which a circuit element 30 or a circuit component (not illustrated) as an electronic element is connected to the lower surface (the substrate surface of the first substrate 11 on which the connection terminal 25 is provided) of the container 10 of the quartz crystal oscillator 1 of the first embodiment. Other constituent elements such as the lead terminal 24 which includes the first bent section 51, the second bent section 52, and the third bent section 53 and is connected to the connection terminal 25 are the same as those of the first embodiment, and thus description thereof will be omitted.

The circuit element 30 or the circuit component (not illustrated) is electrically connected to a land electrode 39 disposed between the connection terminals 25 which are arranged in two rows on the lower surface of the container 10. The land electrode 39 is electrically connected to the quartz crystal vibrator element 17, the integrated circuit 19, or the like via a wiring electrode (not illustrated). The circuit element 30 or the circuit component (not illustrated) adjusts, for example, an oscillation circuit or the like included in the quartz crystal vibrator element 17 or the integrated circuit 19.

According to the quartz crystal oscillator 1b of the second embodiment, the circuit element 30 or the electronic component is disposed outside the container 10 but is located inside the lead terminals 24 of the two rows connected to the container 10. Consequently, even if an external force such as an impact is applied to the quartz crystal oscillator 1b, the circuit element 30 or the circuit component is protected by the stress alleviation action or the like of the lead terminal 24 including the first bent section 51, the second bent section 52, and the third bent section 53. For this reason, it is possible to reduce the possibility of the occurrence of a defect such as damage of the quartz crystal oscillator 1*b* as an electronic component and thus to reduce the reliability thereof.

Third Embodiment

Figure 6A:
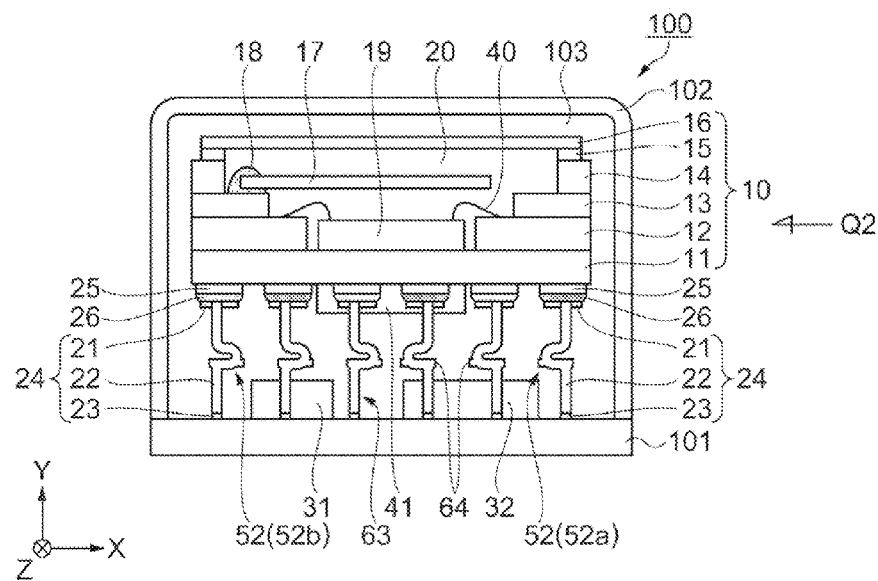
Figure 6B:
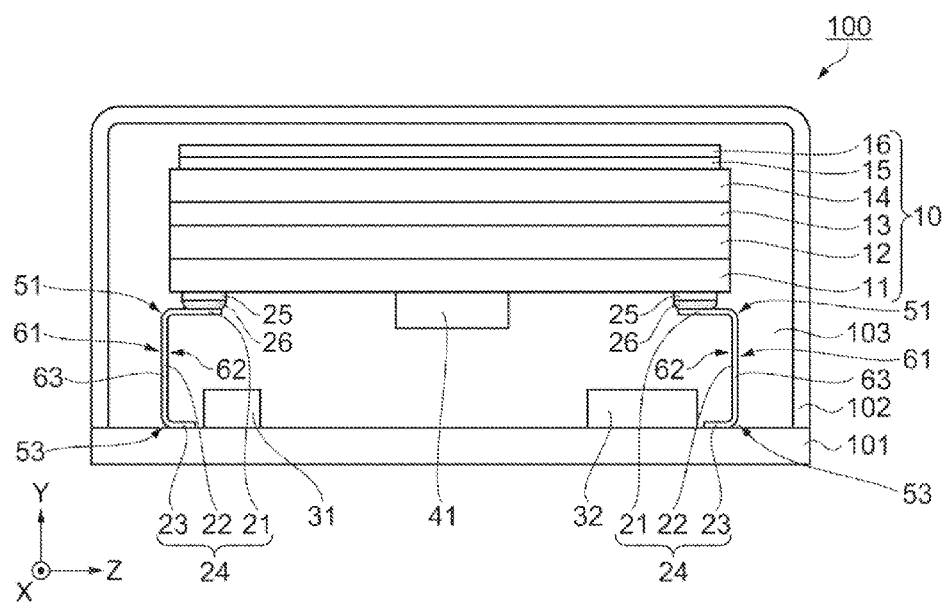

With reference to FIGS. 6A and 6B, an oscillator as an example of an electronic component according to a third embodiment of the invention will be described by exemplifying an oven controlled crystal oscillator (OCXO) including an SC cut quartz crystal vibrator element having good frequency stability.

FIGS. 6A and 6B are schematic diagrams illustrating a structure of an oscillator as an example of an electronic component according to the third embodiment of the invention, in which FIG. 6A is a front sectional view, and FIG. 6B is a side view which is viewed from a direction Q2 illustrated in FIG. 6A. For convenience of description of a configuration of a quartz crystal oscillator 100, FIG. 6B illustrates a state in which a cover 102 is sectioned. In this description, an X axis, a Y axis, a Z axis, an upper surface, and a lower surface are used in the same manner as in the first embodiment. Wiring patterns or electrode pads formed on the upper surface of a base substrate 101, and connection electrodes formed on the outer surface of the container 10 and wiring patterns or electrode pads formed inside the container 10 are not illustrated.

The quartz crystal oscillator 100 as an electronic component has low external stress sensitivity, and thus an SC cut quartz crystal vibrator element 17 having good frequency stability is used. As illustrated in FIGS. 6A and 6B, the quartz crystal oscillator 100 includes the container 10 which stores a quartz crystal vibrator element 17 in an internal space 20 and an integrated circuit 19 including an oscillation circuit; and lead terminals 24 which are connected to connection terminals 25 provided on a lower surface of the container 10; a heating body 41 which is connected to the lower surface of the container 10; and circuit components 31 and 32 which are disposed on an upper surface of the base substrate 101. The container 10 is disposed so as to be separated from the base substrate 101 via the lead terminals 24, and the circuit components 31 and 32 such as a plurality of capacitors or resistors are disposed on the upper surface of the base substrate 101 of the quartz crystal oscillator 100. The container 10, the circuit components 31 and 32, and the like are covered with the cover 102 and are stored in the inside 103 of the cover 102. The inside 103 of the cover 102 may be sealed air-tightly in a depressed atmosphere such as vacuum state or pressure lower than the atmospheric pressure, or in an atmosphere of an inert gas such as nitrogen, argon, or helium, or may not be sealed air-tightly.

The lower surface of the container 10 is one surface of the first substrate 11 as a substrate constituting the container 10 and is a surface opposite side to the internal space 20 side of the container 10.

As a constituent material of the cover 102, a material is preferably used which is obtained by plating an iron-based alloy having low heat conductivity, such as 42 alloy (iron-nickel alloy) with nickel.

A configuration of the container 10 including the quartz crystal vibrator element 17 and the like stored in the container 10 is the same as that of the first embodiment, and thus description thereof will be omitted. A configuration of the lead terminal 24 connected to the connection terminal 25 of the container 10 is also the same as that of the first embodiment, and thus description thereof will be omitted.

The heating body 41 connected to the lower surface of the container 10 is constituted by a power transistor, a resistor heating body, and the like. The heating body 41 controls the temperature of the container 10 so as to reduce a variation in a resonance frequency due to the temperature change in the quartz crystal vibrator element 17. The heating body 41 may be disposed in the internal space 20 of the container 10. As mentioned above, if the heating body 41 is disposed in the internal space 20, it is possible to efficiently control the temperature of the quartz crystal vibrator element 17.

The base substrate 101 is made of a material such as an insulated glass epoxy resin or ceramics. A wiring (not illustrated) provided on the base substrate 101 is formed by using a method of etching a substrate in which a copper foil is applied on the entire surface thereof, or a method of screen printing a metal wiring material such as tungsten (W) or molybdenum (Mo) on a substrate, baking the material, and plating the material with nickel (Ni) or gold (Au).

In the same manner as in the first embodiment, in the lead terminal 24 which includes the first bent section 51, the second bent section 52, and the third bent section 53 and includes the connection pad 21 connected to the connection terminal 25 of the container 10, the lead end portion 23 is connected to a wiring (not illustrated) provided on the base substrate 101 via the lead portion 22 by using a soldering method. In a case of an oven controlled crystal oscillator (OCXO) for controlling the temperature of the quartz crystal vibrator element 17 as in the present embodiment, as a constituent material of the lead terminal 24, an iron-based alloy having low heat conductivity such as 42 alloy (iron-nickel alloy) is preferably used since heat inside the container 10 is unlikely to escape to the outside via the lead terminal 24.

According to the quartz crystal oscillator 100 of the third embodiment, since the first bent section 51, the second bent section 52, and the third bent section 53 are provided at the lead terminal 24, stress applied to the lead terminal 24 is absorbed or distributed by each of the bent sections. Consequently, it is possible to reduce a concern that the connection pad 21 connected to the first substrate 11 (the container 10) or the lead portion 22 near the connection pad 21 may be deformed or damaged (cracked or ruptured) due to stress applied to the lead terminal 24, or to reduce deterioration of the joining strength due to a crack or the like generated in the joining member 26 connecting the connection terminal 25 to the connection pad 21. In addition, even if an external force such as an impact is applied to the quartz crystal oscillator 100, the heating body 41 or the circuit components 31 and 32 are protected by the stress alleviation action or the like of the lead terminal 24. For this reason, it is possible to reduce the possibility of the occurrence of a defect such as damage of the quartz crystal oscillator 100 as an electronic component.

Therefore, since the temperature of the quartz crystal vibrator element 17 can be controlled by the heating body 41, it is possible to reduce a variation in a resonance frequency due to the temperature change in the quartz crystal vibrator element 17 and also to improve impact resistance characteristics, thereby providing the oven controlled crystal oscillator (OCXO) of which long-term reliability of functional characteristics is improved.

In the above-described embodiments, the lead terminal 24 has been described to be of a so-called J lead type in which the first bent section 51 and the third bent section 53 in the present embodiment are bent toward the second surface 62 from the first surface 61 of the lead terminal 24, and the extension direction of the lead portion 22 extending from the connection pad 21 to the first bent section 51 is opposite to the extension direction of the lead end portion 23 from the third bent section 53, but is not limited thereto.

In relation to bending directions of the first bent section 51 and the third bent section 53 of the lead terminal 24, for example, the first bent section 51 may be bent toward the second surface 62 of the first surface 61 of the lead terminal 24, and the third bent section 53 may be bent toward the first surface 61 from the second surface 62. In a case of employing such a configuration, the first bent section 51 is mountain-folded with the first surface 61 of the lead terminal 24 as the outside (front side), and the third bent section 53 is valley-folded with the first surface 61 of the lead terminal 24 as the outside (front side). Therefore, the lead terminal 24 has a so-called gull-wing lead type shape in which the extension direction of the lead portion 22 extending from the connection pad 21 to the first bent section 51 is same as the extension direction of the lead end portion 23 from the third bent section 53.

As described above, even if the first bent section 51 and the third bent section 53 are configured in the gull-wing lead type, the second bent section 52 is also provided, and thus the same effects as in the above-described embodiments can be achieved.

The quartz crystal vibrator element 17 exemplified in the embodiments which employs the rectangular SC cut quartz crystal vibrator element is used as an example, but is not limited thereto, and a circular SC cut quartz crystal vibrator element or a rectangular AT cut or circular AT cut quartz crystal vibrator element may be used. In addition, a tuning fork type quartz crystal vibrator element, a surface acoustic wave resonator element, and other piezoelectric vibrators and microelectromechanical system resonator (MEMS) elements may be used. As a substrate material of the vibrator element, not only the quartz crystal but also a piezoelectric material such as a piezoelectric single crystal of Lithium Tantalate or Lithium Niobate, or piezoelectric ceramics, for example, Zirconate Titanate, or a silicon semiconductor material may be used. As an excitation method of the vibrator element, a piezoelectric effect may be used, and electrostatic driving using Coulomb force may be used.

In the above-described embodiments, the quartz crystal oscillators 1, 1b and 100 using the quartz crystal vibrator element 17 have been described as an example of an electronic component according to one embodiment of the invention but are not limited thereto and are applicable to, for example, electronic components having other functions, such as a sensor having an acceleration or angular velocity sensor element built thereinto.

Modification Example of Second Bent Section

Figure 7A:
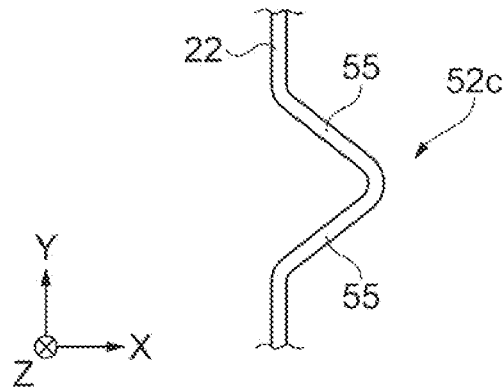
Figure 7B:
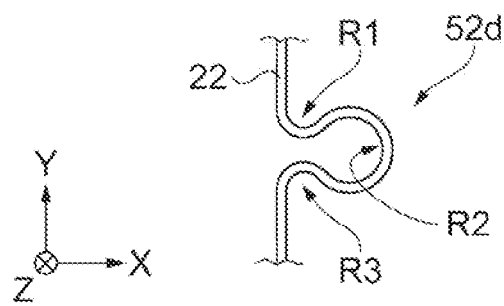
Figure 7C:
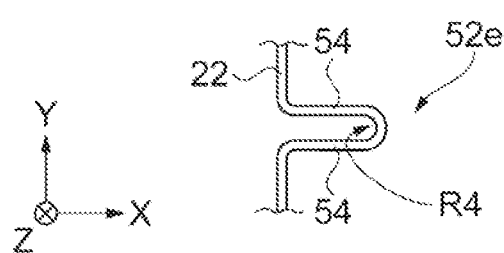

Next, a description will be made of modification examples of the second bent section 52 of the above-described lead terminal 24 with reference to FIGS. 7A to 7C. FIGS. 7A to 7C illustrate modification examples of the second bent section of the lead terminal, in which FIG. 7A is a front view illustrating Modification Example 1, FIG. 7B is a front view illustrating Modification Example 2, and FIG. 7C is a front view illustrating Modification Example 3. In the following description, the same constituent elements as those of the above-described embodiments are given the same reference numerals, and description thereof will be omitted.

Modification Example 1

With reference to FIG. 7A, Modification Example 1 of the second bent section will be described. A second bent section 52c illustrated in FIG. 7A is constituted by two sides 55 which are folded so as to form an obtuse angle in the X axis direction from the lead portion 22. In other words, the second bent section 52c of Modification Example 1 is constituted by two sides 55 of a triangle which is provided so as to be open in the −X axis direction. In addition, connection between the two sides 55 and the lead portion 22, and connection between the two sides 55 may be a substantially linear connection, and may be a connection with an R shape such as an arc shape.

Modification Example 2

With reference to FIG. 7B, Modification Example 2 of the second bent section will be described. A second bent section 52d illustrated in FIG. 7B is formed of a folded section R2 which has a major arc shape and is folded. Each of connection sections R1 and R3 where the folded section R2 is connected to the lead portion 22 has an R shape so as to form an arc shape. In other words, the second bent section 52d of Modification Example 2 is constituted by the folded section R2 which is provided so as to be open in the −X axis direction and has a major arc shape.

Modification Example 3

With reference to FIG. 7C, Modification Example 3 of the second bent section will be described. A second bent section 52e illustrated in FIG. 7C has a configuration in which second ends of two sides 54 of which first ends are connected to the lead portion 22 and which are provided in parallel to each other are connected to each other via an arc folded section R4. In other words, the second bent section 52e of Modification Example 3 has a track shape and is provided so as to be open in the −X axis direction. In addition, connection between the two sides 54 and the lead portion 22, and connection between the two sides 54 may be a substantially linear connection, and may be a connection with an R shape such as an arc shape.

In the description of the above Modification Examples 1 to 3, for convenience of description, the second bent sections 52c, 52d and 52e are bent in the +X axis direction and are open in the −X axis direction, but are not limited thereto, and may be bent in opposite directions. In other words, the second bent sections 52c, 52d and 52e may be bent in the −X axis direction and are open in the +X axis direction.

Also in the second bent sections 52c, 52d and 52e of the above-described Modification Examples 1 to 3, in the same manner as in the above-described embodiments, deformation may easily occur in the Y axis direction and the X axis direction, and stress in these directions can be effectively alleviated.

Although a configuration of the second bent section 52 has been described along with the modification examples, the second bent section 52 is not limited to the above-described configuration, and the above-described effects can be achieved as long as the second bent section 52 has a shape which protrudes in a direction intersecting the extension direction of the lead portion 22 so as to be folded. In other words, the above-described effects can be achieved even if the second bent section 52 does not necessarily protrude in the X axis direction.

Electronic Apparatus

Next, with reference to FIGS. 8A, 8B and 9, a detailed description will be made of electronic apparatuses to which at least one of the quartz crystal oscillators 1, 1b and 100 as an example of an electronic apparatus according to one embodiment of the invention is applied. The description will be made of an example in which the quartz crystal oscillator 1 is applied.

Figure 8A:
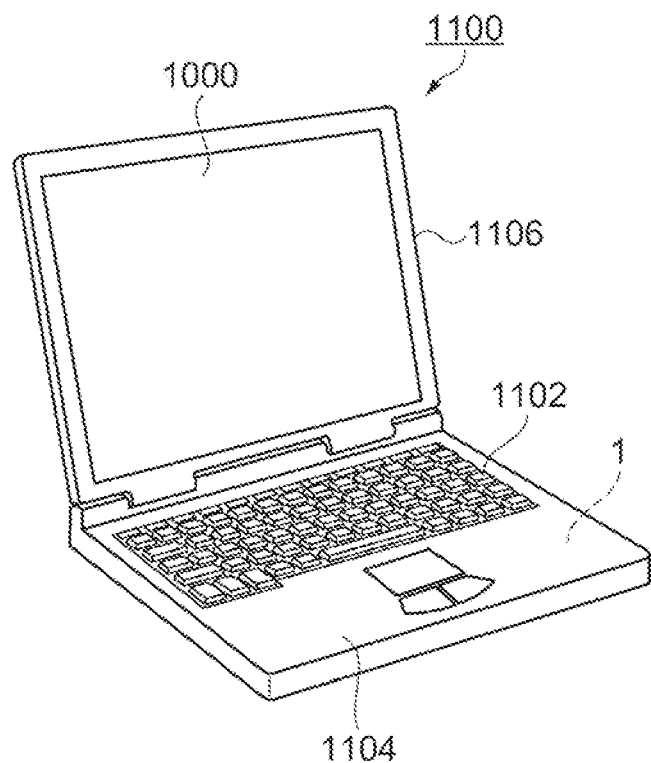
Figure 8B:
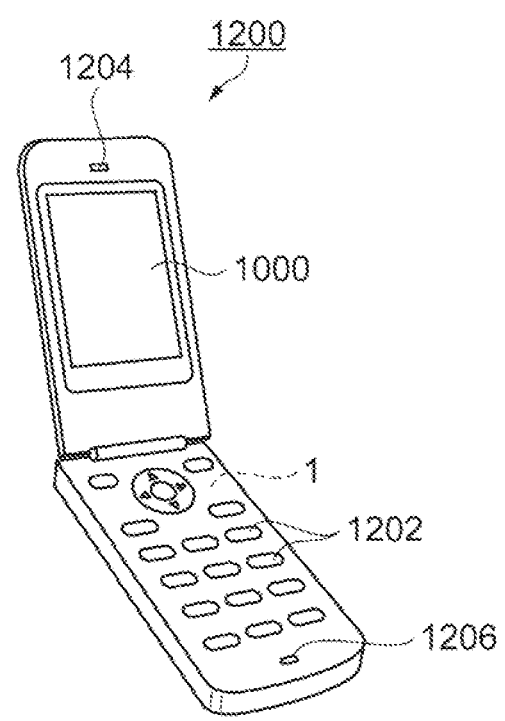

FIGS. 8A and 8B are schematic diagrams illustrating electronic apparatuses including the quartz crystal oscillator 1 according to one embodiment of the invention, in which FIG. 8A is a perspective view illustrating a configuration of a mobile type (or a notebook type) personal computer 1100, and FIG. 8B is a perspective view illustrating a configuration of a mobile phone 1200 (including PHS).

In FIG. 8A, a personal computer 1100 is constituted by a main body portion 1104 having a keyboard 1102 and a display unit 1106 having a display portion 1000, and the display unit 1106 is supported so as to be rotatably moved with respect to the main body portion 1104 via a hinge structure portion. The personal computer 1100 includes the quartz crystal oscillator 1, built thereinto, which has high frequency stability.

In FIG. 8B, a mobile phone 1200 includes a plurality of operation buttons 1202, an earpiece 1204, and a mouthpiece 1206, and a display portion 1000 which is disposed between the operation buttons 1202 and the earpiece 1204. The mobile phone 1200 includes the quartz crystal oscillator 1, built thereinto, which has high frequency stability.

Figure 9:
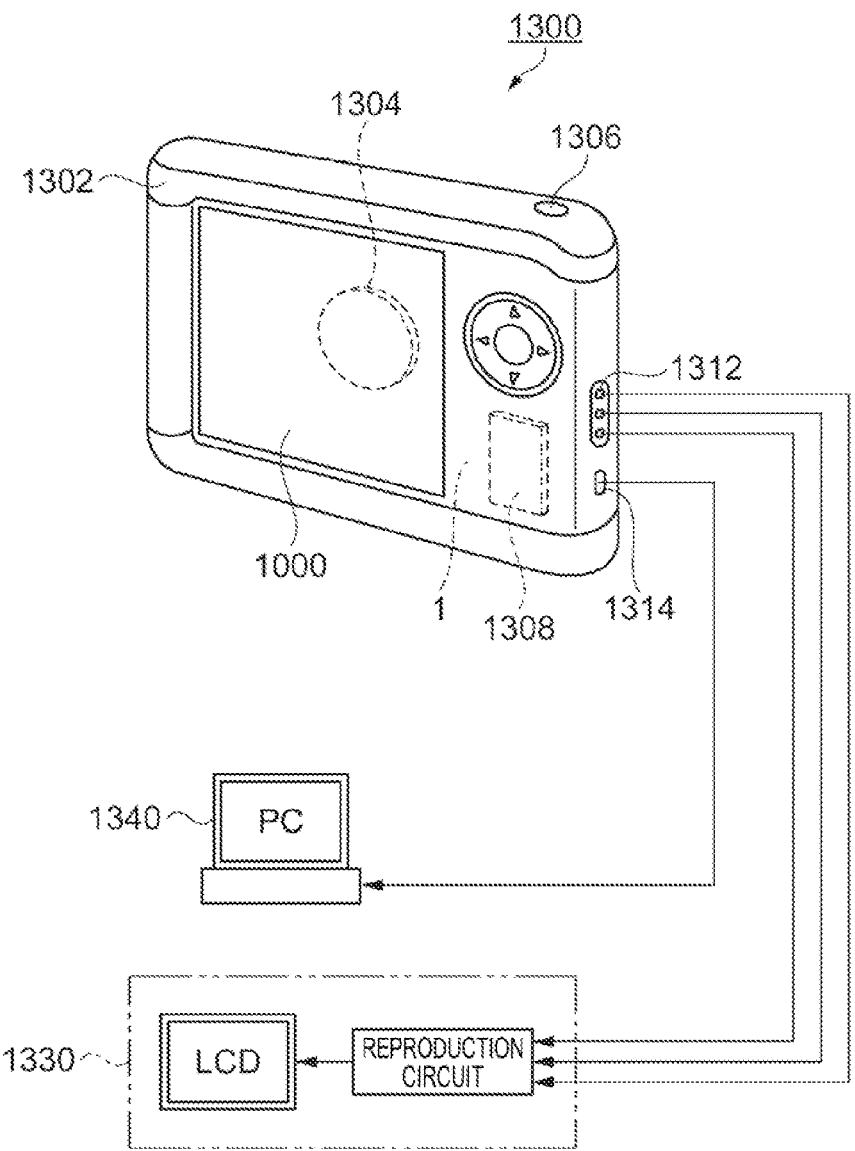
FIG. 9 is a perspective view illustrating a configuration of a digital camera as an electronic apparatus including the electronic component according to one embodiment of the invention.

FIG. 9 is a perspective view illustrating a configuration of a digital camera 1300 as an electronic apparatus including the quartz crystal oscillator 1 according to one embodiment of the invention. In FIG. 9, connection to an external apparatus is also briefly illustrated.

The digital camera 1300 performs photoelectric conversion on a light image of a subject by using an imaging device such as a charge coupled device (CCD) so as to generate an imaging signal (image signal).

A display portion 1000 is provided on a rear side of a case (body) 1302 of the digital camera 1300 and performs display on the basis of an imaging signal generated by the CCD, and the display portion 1000 functions as a view finder which displays a subject as an electronic image. In addition, a light sensing unit 1304 which includes an optical lens (imaging optical system), a CCD, and the like is provided on a front side (the rear side in FIG. 9) of the case 1302.

When a photographer confirms a subject image displayed on the display portion 1000 and presses a shutter button 1306, an imaging signal of the CCD at this point is transmitted to and stored in the memory 1308. In this digital camera 1300, video signal output terminals 1312 and input and output terminals 1314 for data communication are provided on a side surface of the case 1302. As illustrated in FIG. 9, the video signal output terminals 1312 are connected to a television monitor 1330 and the input and output terminals 1314 for data communication are connected to a personal computer 1340 as necessary. An imaging signal stored in the memory 1308 is output to the television monitor 1330 or the personal computer 1340 through a predetermined operation. The digital camera 1300 includes the quartz crystal oscillator 1, built thereinto, which has high frequency stability.

As described above, the quartz crystal oscillators 1, 1b and 100 having high frequency stability are used in an electronic apparatus, and thus it is possible to provide a higher performance electronic apparatus. If at least one of the quartz crystal oscillators 1, 1b and 100 according to one embodiment of the invention is applied to the electronic apparatus, for example, even when stress such as an impact or vibration is applied to the electronic apparatus and thus the stress is applied to the quartz crystal oscillator 1, 1b or 100, the stress applied to the lead terminals of the quartz crystal oscillator 1, 1b or 100 is absorbed or distributed by each of the bent sections. Therefore, it is possible to reduce a concern that the connection pad of the quartz crystal oscillator 1, 1b or 100 or the lead portion near the connection pad may be deformed or damaged (cracked or ruptured), or to reduce a concern about deterioration of the joining strength between the connection pad and the connection terminal of the quartz crystal oscillator 1, 1b or 100 due to a crack or the like generated in the joining member connecting the connection terminal to the connection pad. For this reason, it is possible to provide the electronic apparatus with high reliability.

The quartz crystal oscillators 1, 1b and 100 according to one embodiment of the invention are applicable not only to the personal computer 1100 (a mobile type personal computer) of FIG. 8A, the mobile phone 1200 of FIG. 8B, and the digital camera 1300 of FIG. 9, but also to electronic apparatuses, for example, an ink jet type ejection apparatus (for example, an ink jet printer), a laptop type personal computer, a tablet type personal computer, a television, a video camera, a video tape recorder, a car navigation apparatus, a pager, an electronic organizer (including a communication function), an electronic dictionary, an electronic calculator, an electronic gaming machine, a workstation, a videophone, a security television monitor, electronic binoculars, a POS terminal, a medical apparatus (for example, an electronic thermometer, a sphygmomanometer, a blood glucose monitoring system, an electrocardiographic apparatus, an ultrasonic diagnostic apparatus, or an electronic endoscope), a fish-finder, various measurement apparatuses, meters and gauges (for example, meters and gauges of vehicles, aircrafts, and ships), a flight simulator, an apparatus for a mobile communication base station, a storage area network apparatus such as a router or a switch, a local area network apparatus, a network transmission apparatus, a head mounted display, a motion tracer, a motion tracker, a motion controller, and a pedestrian dead reckoning (PDR) apparatus.

Moving Object

Next, with reference to FIG. 10, a detailed description will be made of a moving object to which at least one of the quartz crystal oscillators 1, 1b and 100 as an example of an electronic apparatus according to one embodiment of the invention is applied. The description will be made of an example in which the quartz crystal oscillator 1 is applied.

Figure 10:
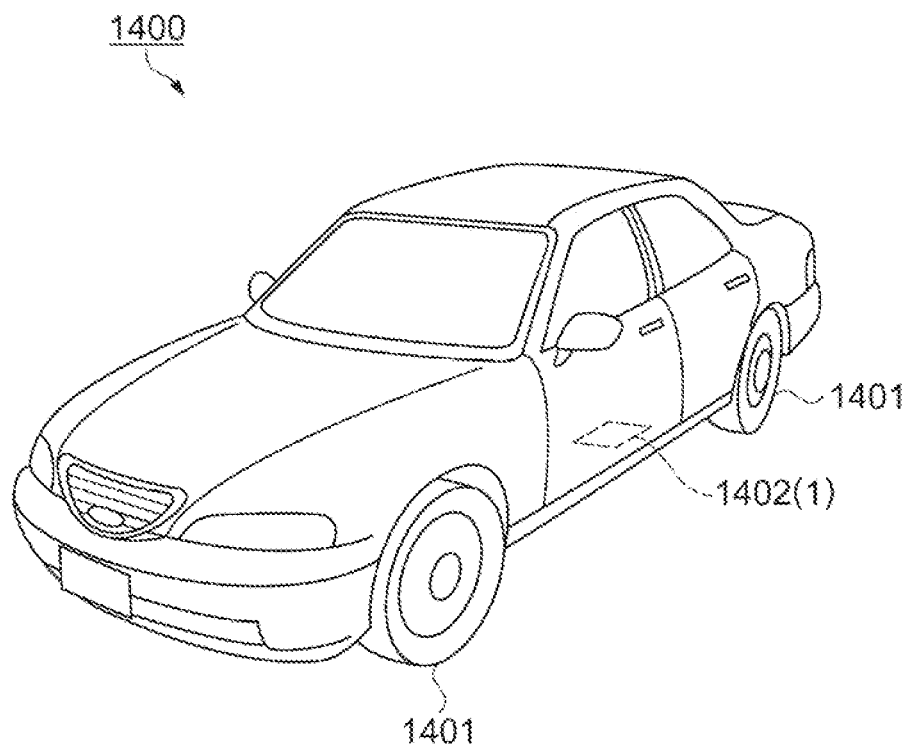
FIG. 10 is a perspective view illustrating a configuration of an automobile as a moving object including the electronic component according to one embodiment of the invention.

FIG. 10 is a perspective view illustrating a configuration of an automobile 1400 as an example of a moving object including the quartz crystal oscillator 1 according to one embodiment of the invention.

A gyro sensor including the quartz crystal oscillator 1 according to one embodiment of the invention is mounted in the automobile 1400. For example, as illustrated in FIG. 10, an electronic control unit 1402 which has the gyro sensor, built thereinto, controlling tires 1401, is mounted in the automobile 1400 as a moving object. As other examples, the quartz crystal oscillator 1 is widely applicable to electronic control units (ECU) such as a keyless entry, an immobilizer, a car navigation system, a car air conditioner, an antilock brake system (ABS), an air bag, a tire pressure monitoring system (TPMS), engine control, a brake system, a battery monitor of a hybrid car or an electric car, and a vehicle dynamic control system.

As described above, any one of the quartz crystal oscillators 1, 1b and 100 having high frequency stability is used in the automobile 1400 as a moving object, and thus it is possible to provide the higher performance moving object. If at least one of the quartz crystal oscillators 1, 1b and 100 according to one embodiment of the invention is applied to the moving object, for example, even when stress such as an impact or vibration is applied to the moving object and thus the stress is applied to the quartz crystal oscillator 1, 1b or 100, the stress applied to the lead terminals of the quartz crystal oscillator 1, 1b or 100 is absorbed or distributed by each of the bent sections. Therefore, it is possible to reduce a concern that the connection pad of the quartz crystal oscillator 1, 1b or 100 or the lead portion near the connection pad may be deformed or damaged (cracked or ruptured), or to reduce a concern about deterioration in the joining strength between the connection pad and the connection terminal of the quartz crystal oscillator 1, 1b or 100 due to a crack or the like generated in the joining member connecting the connection terminal to the connection pad. For this reason, it is possible to provide the moving object with high reliability.

As mentioned above, the electronic apparatuses and the moving object to which the quartz crystal oscillators 1, 1b and 100 according to the embodiments of the invention are applied have been described with reference to the drawings, but the invention is not limited thereto, and a configuration of each portion may be replaced with any configuration having the same function. Any other constituent element may be added to the invention. The above-described respective embodiments may be combined with each other as appropriate.

The entire disclosure of Japanese Patent Application No. 2014-150485, filed Jul. 24, 2014 is expressly incorporated by reference herein.

What is claimed is:

1. An electronic component comprising:
a substrate that is provided with a connection terminal; and
a lead terminal that includes a first surface, a second surface which is a rear surface of the first surface, and a third surface which connects the first surface to the second surface, and includes a connection pad, a lead portion connected to the connection pad, and a lead end portion provided at the lead portion on an opposite side to the connection pad,
wherein the first surface of the connection pad is connected to the connection terminal via a joining member, and
wherein the lead portion includes
a first bent section that is bent in a direction intersecting the first surface or the second surface;
a second bent section that is bent in a direction intersecting the third surface between the first bent section and the lead end portion; and
a third bent section that is bent in a direction intersecting the first surface or the second surface between the second bent section and the lead end portion,
the first surface and the second surface being substantially flat between the first bent section and the second bent section.

2. The electronic component according to claim 1, wherein the first bent section and the third bent section are bent toward the second surface from the first surface.

3. The electronic component according to claim 2, wherein the lead terminal is provided in plurality, and
wherein the second bent sections of the lead terminals disposed at both ends of the plurality of lead terminals are bent toward the adjacent lead terminals.

4. The electronic component according to claim 2, wherein an electronic element is disposed on a surface of the substrate on which the connection terminal is provided.

5. The electronic component according to claim 1, wherein the first bent section is bent toward the second surface from the first surface, and
wherein the third bent section is bent toward the first surface from the second surface.

6. The electronic component according to claim 5, wherein an electronic element is disposed on a surface of the substrate on which the connection terminal is provided.

7. The electronic component according to claim 1, wherein the lead terminal is provided in plurality, and
wherein the second bent sections of the lead terminals disposed at both ends of the plurality of lead terminals are bent toward the adjacent lead terminals.

8. The electronic component according to claim 1, wherein an electronic element is disposed on a surface of the substrate on which the connection terminal is provided.

9. An electronic apparatus comprising the electronic component according to claim 1.

10. A moving object comprising the electronic component according to claim 1.

11. A crystal oscillator, comprising:
the electronic component according to claim 1;
a heating body disposed on a lower surface of the substrate;
an oscillation circuit disposed over the substrate; and
a crystal vibrator element disposed over the oscillation circuit.

12. A manufacturing method for an electronic component including a substrate that is provided with a connection terminal; and a lead terminal that includes a first surface, a second surface which is a rear surface of the first surface, and a third surface which connects the first surface to the second surface, and includes a connection pad, a lead portion connected to the connection pad, and a lead end portion provided at the lead portion on an opposite side to the connection pad, in which the first surface of the connection pad is connected to the connection terminal via a joining member, and in which the lead portion includes a first bent section that is bent in a direction intersecting the first surface or the second surface; a second bent section that is bent in a direction intersecting the third surface between the first bent section and the lead end portion; and a third bent section that is bent in a direction intersecting the first surface or the second surface between the second bent section and the lead end portion, the first surface and the second surface being substantially flat between the first bent section and the second bent section, the manufacturing method comprising:
connecting the connection pad of the lead terminal provided with the second bent section to the connection terminal; and
forming the first bent section and the third bent section.

13. The manufacturing method for an electronic component according to claim 12, further comprising:
preparing a lead frame in which a recess is provided at a connecting portion in a direction intersecting the first surface or the second surface before connecting the connection pad to the connection terminal, a plurality of lead terminals being connected to adjacent lead terminals via the connecting portion,
wherein the forming of the first bent section and the third bent section includes removing the connecting portion.

14. An electronic component comprising:
a substrate that is provided with a connection terminal; and
a lead terminal that includes
a lead portion extending along a first direction;
a connection pad extending along a second direction intersecting the first direction;
a lead end portion extending along the second direction;
a first bent section connecting the lead portion and the connection pad; and a third bent section connecting the lead portion and the lead end portion, wherein the connection pad is connected to the connection terminal via a joining member, and wherein the lead portion includes a second bent section that is protruding along a third direction intersecting the first direction and the second direction, the lead portion being substantially flat along a surface extending in the first direction between the first bent section and the second bent section.

15. The electronic component according to claim 14, wherein the connection pad and the lead end portion are extending toward the same direction from the lead portion.

16. The electronic component according to claim 14, wherein the connection pad and the lead end portion are extending toward the opposite direction from the lead portion.

17. The electronic component according to claim 14, wherein the lead terminal is provided in plurality, and wherein the second bent sections of the lead terminals disposed at both ends of the plurality of lead terminals are bent toward the adjacent lead terminals.

18. A crystal oscillator, comprising:

the electronic component according to claim 14;

a heating body disposed on a lower surface of the substrate;

an oscillation circuit disposed over the substrate; and a crystal vibrator element disposed over the oscillation circuit.

19. A manufacturing method for an electronic component including a substrate that is provided with a connection terminal; and a lead terminal that includes a lead portion extending along a first direction, a connection pad extending along a second direction intersecting the first direction, a lead end portion extending along the second direction, a first bent section connecting the lead portion and the connection pad, and a third bent section connecting the lead portion and the lead end portion, in which the connection pad is connected to the connection terminal via a joining member, and in which the lead portion includes a second bent section that is protruding along a third direction intersecting the first direction and the second direction, the lead portion being substantially flat along a surface extending in the first direction between the first bent section and the second bent section, the manufacturing method comprising:

connecting the connection pad of the lead terminal provided with the second bent section to the connection terminal; and forming the first bent section and the third bent section.

20. The manufacturing method for an electronic component according to claim 19, further comprising:

preparing a lead frame in which a recess is provided at a connecting portion in the third direction before connecting the connection pad to the connection terminal, a plurality of lead terminals being connected to adjacent lead terminals via the connecting portion, wherein the forming of the first bent section and the third bent section includes removing the connecting portion.

* * * * *